United States Patent [19]

Kerr

[11] 3,918,080

[45] Nov. 4, 1975

[54] MULTIEMITTER TRANSISTOR WITH CONTINUOUS BALLAST RESISTOR

[75] Inventor: George Kerr, Eindhoven, Netherlands

[73] Assignee: U.S. Philips Corporation, New York, N.Y.

[22] Filed: July 12, 1973

[21] Appl. No.: 378,589

Related U.S. Application Data

[63] Continuation of Ser. No. 153,827, June 16, 1971, abandoned, which is a continuation of Ser. No. 806,894, March 13, 1969, abandoned.

[30] Foreign Application Priority Data

June 21, 1968 Netherlands ..................... 6808722

[52] U.S. Cl. ..................... 357/36; 357/46; 357/51; 357/68; 357/86

[51] Int. Cl.[2] .................... H01L 29/52; H01L 29/72; H01L 49/02

[58] Field of Search ............. 357/36, 46, 51, 68, 86

[56] References Cited

UNITED STATES PATENTS

| | | | |
|---|---|---|---|
| 3,225,261 | 12/1965 | Wolf | 357/51 |
| 3,305,790 | 2/1967 | Parsons et al. | 357/46 |
| 3,462,658 | 8/1969 | Worchel et al. | 357/36 |

FOREIGN PATENTS OR APPLICATIONS

| | | | |
|---|---|---|---|
| 1,044,469 | 9/1966 | United Kingdom | 357/36 |

*Primary Examiner*—William D. Larkins
*Attorney, Agent, or Firm*—Frank R. Trifari; George B. Berka

[57] ABSTRACT

A multi-emitter planar transistor comprises a continuous resistance region coplanar with or located near the surface of emitter regions, finger contacts connecting the emitter regions with spaced portions of the resistance region and an elongated common emitter contact located on another portion of the resistance region and having a long edge opposite the finger contacts.

10 Claims, 6 Drawing Figures

Figure 1:
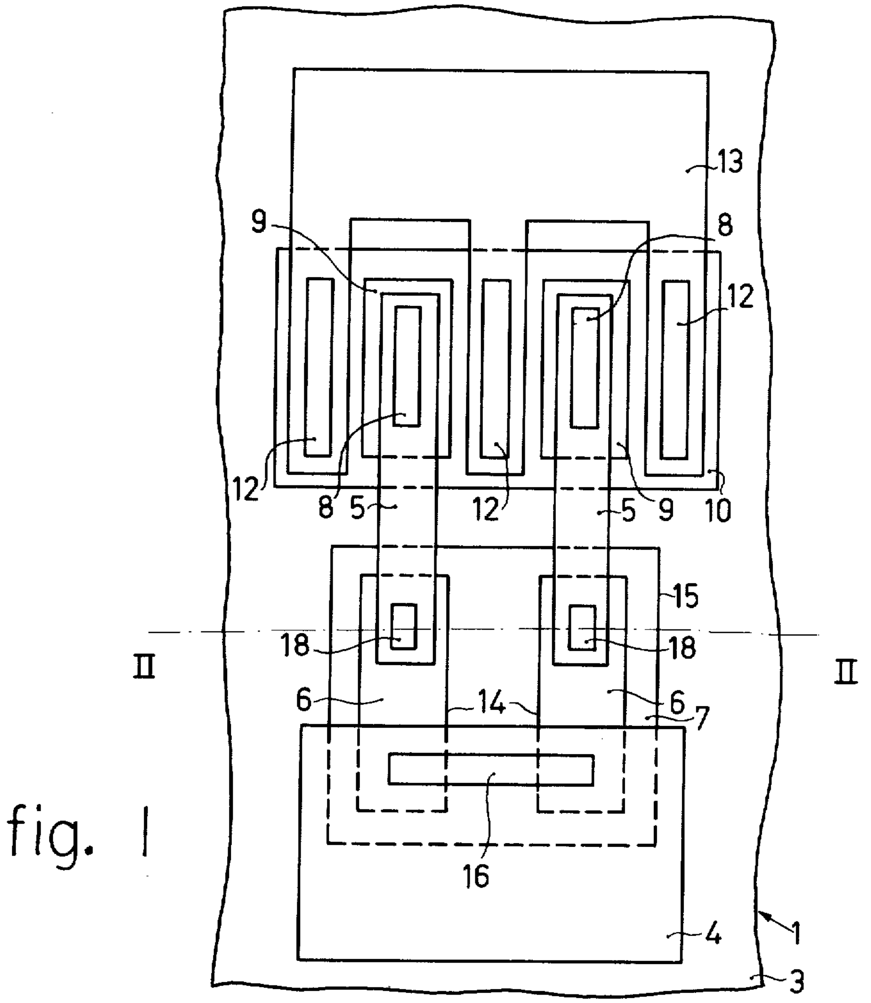

INVENTOR.
GEORGE KERR
BY
AGENT

INVENTOR.

GEORGE KERR

BY

AGENT

INVENTOR.

GEORGE KERR

BY

AGENT

MULTIEMITTER TRANSISTOR WITH CONTINUOUS BALLAST RESISTOR

This is a continuation of application Ser. No. 153,827, filed June 16, 1971, now abandoned, which in turn is a continuation of application Ser. No. 806,894, filed Mar. 13, 1969, now abandoned.

The invention relates to a semiconductor device having a semiconductor body which comprises semiconductor electrode regions, a substantially plane surface of said body being provided with an insulating layer over which a contact extends which comprises several portions, hereinafter referred to as fingers, and a portion common to the fingers, each path connecting a finger to the common portion including a series resistor and the fingers making contact with at least one electrode region through openings in the insulating layer, the said resistors and the said common portion being spaced from said electrode region(s).

In semiconductor devices such contacts having fingers are frequently used, Thus, for example, in integrated circuits in which two or more circuits meet in a common point it may be desirable to include a series resistor in each circuit, these series resistors being equal or at least of the same order of magnitude for reasons of symmetry. The series resistors may, for example, serve to promote a satisfactory current distribution between several parallel connected diodes or transistors.

British patent specification No. 1,044,469 describes a multi-emitter transistor having emitter and base contacts which form an interdigitated configuration, the fingers of the emitter contact being connected to a common portion of this contact through series resistors.

In the known devices, the provision of the series resistors requires addditional photolithographic manufacturing steps including a very accurate alignment of a mask for determining the lateral boundaries of the series resistors and a subsequent critical etching process. Owing to the difficulties involved in these steps the proportion of rejects is high.

It is an object of the invention to provide a semiconductor device of the kind described in the preamble which can be manufactured in a simple manner and with a high yield. The invention is based on the recognition that it is not necessary for the series. resistors to be electrically insulated from one another but that a continuous resistance layer may be used, and that furthermore the use of a continuous resistance layer enables the said highly accurate alignment step to be avoided.

According to the invention a semiconductor device of the kind described in the preamble is characterized in that at least some of the said series resistors form part of a single continious resistance layer.

Such a semiconductor device has a contact which includes series resistors and is adapted to be manufactured in a simple manner, the provision of the resistors requiring no critical additional steps because the dimensions in a direction at right angles to the direction of thickness of the resistance layer have substantially no influence on the resistance values of the resistors. The factors determining the resistance value comprise, in addition to the specific resistivity and the thickness of the resistance layer, mainly the distance between the fingers and the common portion of the contact, this distance not depending on an alignment step but being determined by the mask with the aid of whch the boundaries of the fingers and of the common portion are simultaneously established.

It should be noted that the said British patent specification No. 1,044,469 also describes a transistor having an emitter contact including series resistors, a single continuous resistance layer being used to provide the series resistors. However, in this transistor the series resistors are not included in the paths connecting the fingers to the common portion of the contact, but the emitter contact comprises a continuous metal pattern extending over a resistance layer which is disposed on the insulating layer and in the windows and is completely covered by the metal pattern. Because the resistance layer only is connected to the subjacent emiiter region, the resistance layer constitutes a series resistor between the emitter region and the metal pattern of the contact, the current flowing through the resistance layer in its direction of thickness.

This configuration of series resistors described in the said British patent specification is not equally suitable for all uses. For example, in the case of emitter regions or emitter partial regions having comparatively large surface areas, this configuration may lead to a resistance layer having an impracticably large thickness, and this may even be the case with smaller emitter regions when a comparatively large series resistance is desired.

The invention is of particular importance for use in transistors. As is known, in transistors, especially high-frequency large-power transistors, series resistors are often included in the emitter contact, inter alia as a protection against second breakdown. The size and spacings of the fingers of the contact and the resistance values of the series resistors, for example in the range from a few tenths of an ohm to several ohms, usually are such as to require highly accurate alignment of the mask used for determining the boundaries of the individual resistors. The use of the invention provides a considerably simplified manufacture, and an important embodiment of a semiconductor device according to the invention is characterized in that the contact is the emitter contact of a transistor.

The resistance layer may extend as a layer-shaped region on the insulating layer. Such a layer may, for example, consist of titanium, tantalum, aluminium or a nickel-chromium alloy.

In a further important embodiment of the semiconductor device according to the invention, the resistance in the resistance layer between two adjacent fingers is at least equal to the resistance in the resistance layer between any one finger and the portion of the contact common to the fingers. This leads to satisfactory current distribution between the various fingers.

In a further important embodiment of the semiconductor device according to the invention, the resistance layer is a surface region in the semiconductor body which adjoins the surface and is separated from the adjacent part of the semiconductor body by a *p-n* junction.

Such a surface region is preferably produced by a diffusion process, in which the diffusion depth and the impurity concentration are completely adjusted to the desired resistance value. For this diffusion treatment also, the use of the invention does not introduce accurate aligning steps.

When diffused series resistors are used, accurately aligning steps may also be avoided by carrying out the diffusion to provide the resistors simultaneously with one or more diffusions required for manufacturing a circuit component, for example, the circuit component to be contacted. Thus, in manufacturing a transistor the series resistors may be produced simultaneously with the emitter and/or the base diffusion. Since in a transistor the series resistors are generally surrounded in the semiconductor body by a region forming part of the collector region of the transistor, the required insulation of the series resistors leads to the use of the base diffusion to provide these resistors. On the other hand, the desired low resistance value of the series resistors leads to the desirability of using the emitter diffusion. In practice, a combination of these two diffusions is particularly suitable in which the resistor proper is constituted by a surface region which has been obtained at the same time as the emitter region and which, in order to insulate it, is surrounded by a further surface region which has been obtained simultaneously with the base region. To prevent undesirable transistor action the "emitter-base junction" will preferably be short-circuited.

For unclear reasons, the above described double-diffused resistors hitherto have not been used as the series resistors in the fingers of, for example, the emitter contact of a transistor. In certain cases the reason may be a lack of space, for example, when the spacings between the fingers are too small to permit a doublediffused series resistor to be included in each of the fingers, for because the series resistors each comprise two surface regions and two *p-n* junctions which terminate at the semi-conductor surface, the width of a series resistor may considerably exceed that of a finger.

The invention obviates this disadvantage, and a further embodiment of the semiconductor device in accordance with the invention is characterized in that the resistance layer comprises two regions, the first region being a surface region which in the semiconductor body is entirely surrounded by the second region, the second region forming a *p-n* junction with the surface region and a *p-n* junction with the part of the semiconductor body adjoining the second region, the *p-n* junction between the surface region and the second region being preferably short-circuited.

The two regions of the resistance layer may be formed at the same time as other regions to be formed, for example, the regions of a transistor. Furthermore, in this configuration there is no need for *p-n* junction which terminate at the surface between adjacent series resistors, so that this configuration is also suitable for use in contacts having small finger spacings.

In a further embodiment the surface region is divided into several sub-regions, the *p-n* junction between each sub-region and the second region being short-circuited. In a double-diffused resistance layer having such a configuration the resistance in the resistance layer between adjacent fingers is predominantly determined by the portion of the second region situated between these fingers, because the sheet resistance of the second region usually is materially higher than that of the sub-regions. As a result, this resistance between adjacent fingers may readily have a value which is at least paths situated in the common portion of the contact results in differences in series resistance for the various fingers and this may impair the current distribution.

The said difference in series resistance may be reduced or removed in a variety of manners, for example by using a common portion of the contact of continuously varying thickness. Alternatively, the impurity concentration and/or the diffusion depth of a diffused resistance layer or the thickness of the resistant layer overlying the insulating layer may be made different in different areas.

However, an important embodiment of the semiconductor device in accordance with the invention, in which the common portion of the contact is provided with a connecting lead, is characterized in that the resistance layer is substantially homogeneous layer the shortest distance between a finger and the common portion of the contact being larger for a finger located close to the point of attachment of the said connecting lead to the common portion than for a finger located at a larger distance from this point of attachment.

Such a contact in which the series resistance between the point of attachment and the fingers may readily be made substantially equal for the various fingers, may be manufactured in a very simple manner.

Figure 2:
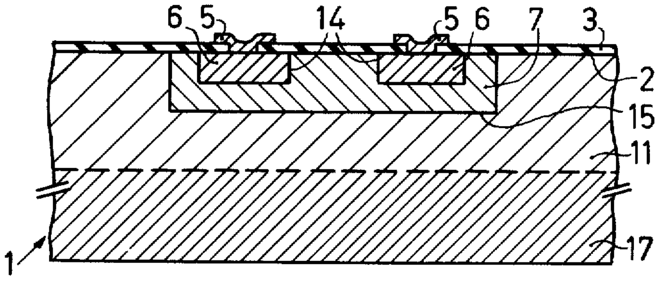
Figure 3:
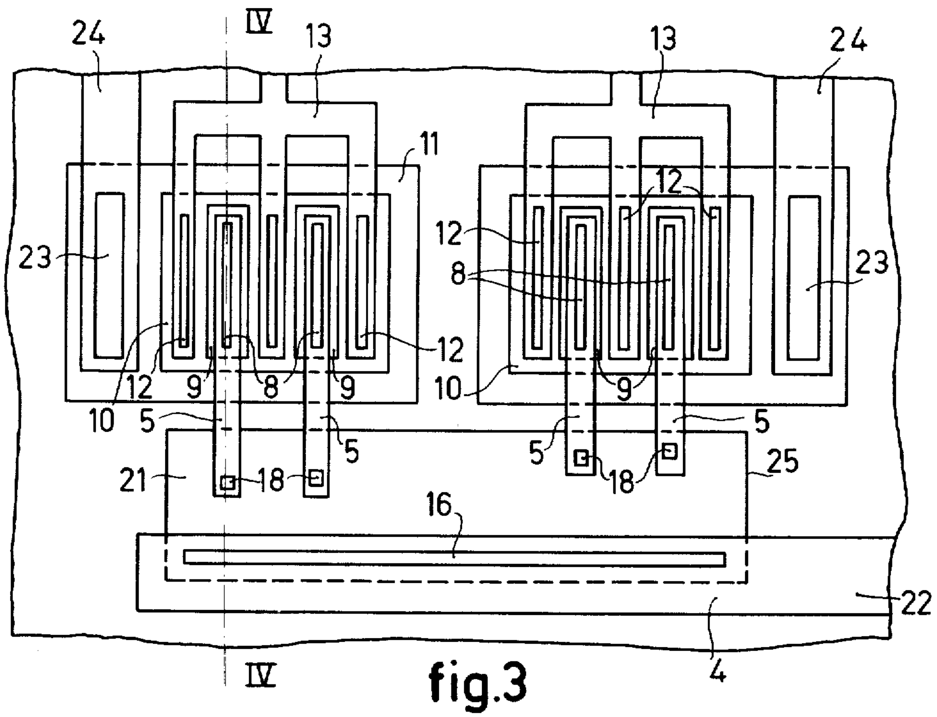
Figure 4:
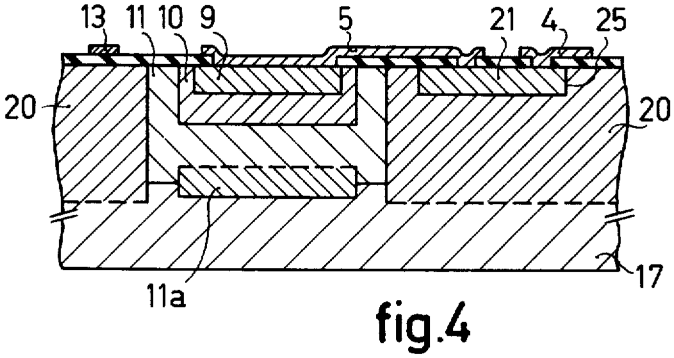
Figure 5:
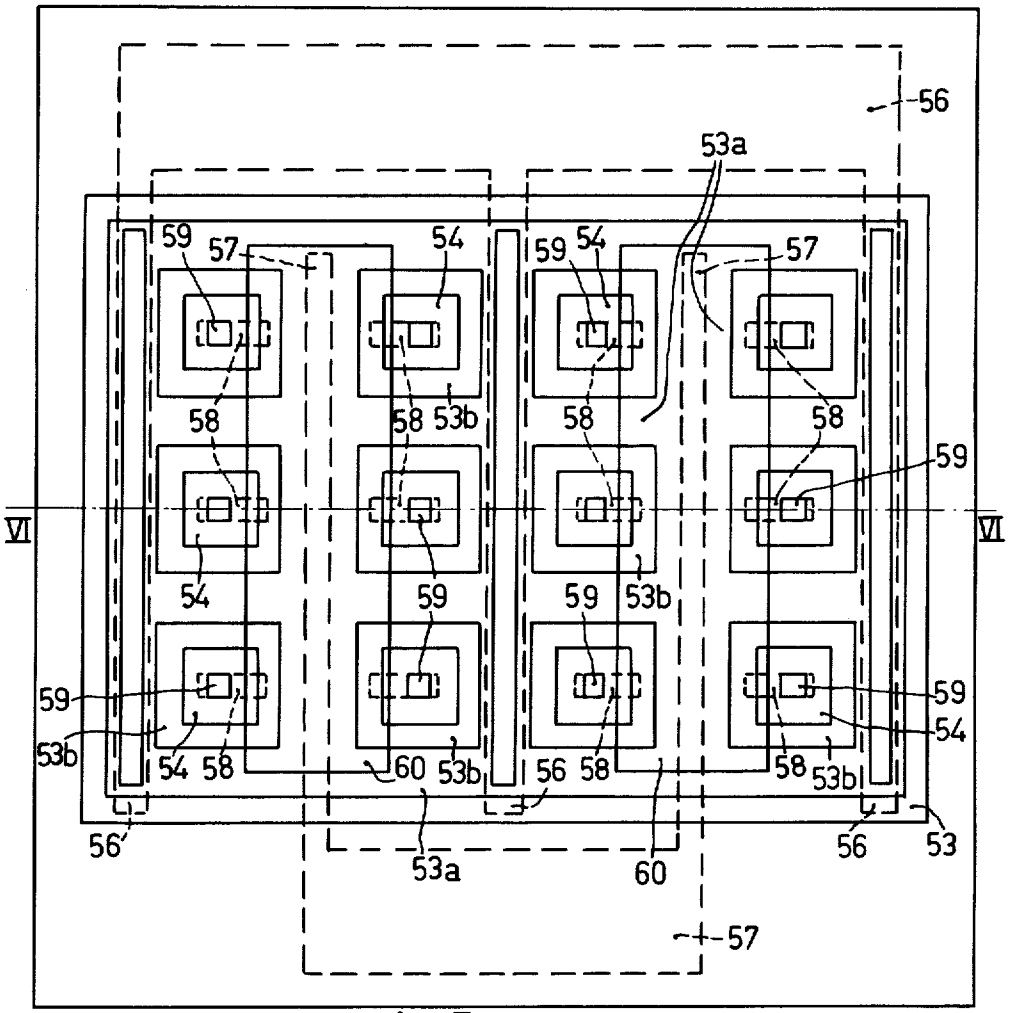
Figure 6:
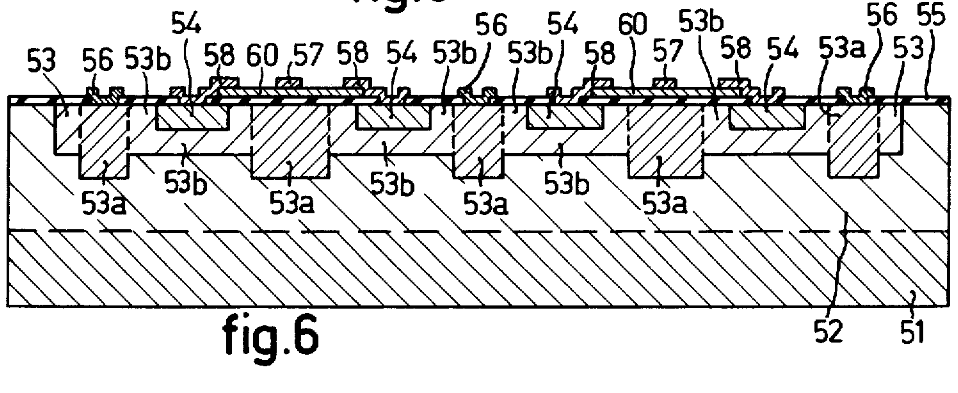

The invention will now be described more fully with reference to some embodiments shown in the accompanying drawings, in which FIG. 1 shows schematically a top plan view of an embodiment of a semiconductor device in accordance with the invention, FIG. 2 is a schematic cross-sectional view of this semiconductor device taken along the line II-II of FIG. 1, FIG. 3 is a schematic top plan view of part of another embodiment of the semiconductor device in accordance with the invention, FIG. 4 is a schematic cross-sectional view of this semiconductor device taken along the line IV—IV of FIG. 3, FIG. 5 is a schematic top plan view of a further embodiment of the semiconductor device in accordance with the invention, FIG. 6 is a schematic cross-sectional view of this semiconductor device taken on the line VI—VI of FIG. 5.

The semiconductor device shown in FIGS. 1 and 2 comprises a semiconductor body 1, a substantially plane surface 2 of which is provided with an insulating layer 3 over which extends a contact 4, 5 which comprises several portions 5, hereinafter referred to as fingers, and a portion 4 common to the fingers 5, the path which connects each finger 5 with the common portion 4 including a series resistor, and the fingers 5 making contact with the semiconductor body 1 through apertures 8 in the insulating layer 3.

According to the invention, at least several of the series resistors form part of a single continuous resistance layer 6, 7.

In the present embodiment the contact 4, 5 is the emitter contact of a transistor. It should be noted that in the plan view of FIG. 1 the insulating layer 3 is assumed to be transparent so that the underlying semiconductor zones are visible. The said transistor has two emitter regions 9 which are surrounded by a base region 10, the adjoining part 11 of the semiconductor body 1 forming part of the collector region. Through windows 12 the base region 10 is contacted by a base contact 13 which also has several fingers, the emitter contact 4, 5 and the base contact 13 together forming an interdigitated pattern.

The resistance layer 6, 7 comprises two regions, the first region being a surface region 6 which in the semiconductor body 1 is entirely surrounded by the second region 7, this second region 7 forming a *p-n* junction 14 with the surface region 6 and a p-n junction 15 with the part 11 of the semiconductor body 1 adjoining the second region. In this embodiment, in order to prevent undesirable transistor action the p-n junction 14 is short-circuited by the common portion 4, which through a window 16 makes contact both with the surface region 6 and with the second region 7.

Obviously, in this embodiment, in which the diffused resistance layer 6, 7 especially the second region 7 of the resistance layer, in the semiconductor body adjoins the collector region 11 of the transistor, short-circuiting of the p-n junction 15 instead of the p-n junction 14 is undesirable. If the p-n junction 15 were short-circuited, in operation the emitter collector voltage would substantially be set up across the p-n junction 14, so that in normal operation of the transistor this p-n junction 14 would be biased in the forward direction and the surface region 6 would not be isolated from the collector region 11.

The surface region 6 is divided into two sub-regions, each p-n junction 14 between a sub-region and the second region 7 being short-circuited. This division into sub-regions is not essential, however, and the surface region 6 may alternatively be coherent.

The transistor shown in FIGS. 1 and 2 may be entirely manufactured in a manner commonly used in semiconductor technology. The semiconductor body 1 may comprise a semiconductor substrate 17 and a layer 11 which is epitaxially deposited on, and has a higher resistivity than, the substrate 17. The epitaxial layer 11 and the substrate 17 are of the same conductivity type and together form the collector region of the transistor. The base region 10 and the second region 7 of a conductivity type opposite to that of the epitaxial layer 11 are provided in this epitaxial layer 11, preferably in a single conventional diffusion treatment. In a subsequent diffusion step the emitter regions 9 and the surface regions 6 may simultenaously be formed.

On the insulating layer 3, which may consist of silicon dioxide, the contacts 4, 5 and 13, which may consist of aluminium or of some suitable electrode material, such as gold or nickel, are provided in a conventional manner, the base contact 13 contacting the base region 10 through apertues 12, the fingers 5 contacting the emitter sub-regions 9 through apertures 8 and the surface subregions 6 of the resistance layer 6, 7 through apertures 18, and the common portion 4 being connected through an aperture 16 both to the surface sub-regions 6 and to the second region 7.

The base contact 13 and the common portion 4 of the emitter contact 4, 5 may be provided with connecting leads in a conventional manner and the substrate 17 may be connected to a collector contact in a conventional manner, whilst the transistor may be encapsulated in a conventional envelope.

The above described transistor in accordance with the invention has an emitter contact which includes series resistors in each finger, the manufacture of these series resistors requiring no additional steps, whilst for the double-diffused series resistors a configuration has been used which provides satisfactory current distribution between the various fingers and may be employed even with small finger spacings. The division of the surface region 6 into sub-regions has the advantage that the resistance in the resistance layer between adjacent fingers, that is to say the resistance of the resistance layer between two adjacent windows 18, is easily higher than the resistance between each window 18 and the window 16, and this improves the current distribution.

Short-circuiting the p-n junctions 14 through the window 16, in other words at the sides of the sub-regions adjacent the common portion 4, provides the advantage that in the operating condition the parts of the p-n junctions 4 remote from the short-circuit i.e. from the window 16, with the usual direction of emitter current flow are reverse-biassed, with the result that the resistance in the resistance layer 6, 7 between adjacent fingers 5 is appreciably higher than the resistance between each individual finger 5 and the common portion 4.

The invention may also be used in integrated circuits. An example of such use is shown in FIGS, 3 and 4. The embodiment includes two transistors the emitters of which are connected to a common connecting lead 22, the combination of transistors being included in a circuit the remainder of which is not of importance for the invention and hence is not shown. In FIGS. 3 and 4 similar parts are designated by the same reference numerals as in FIGS 1 and 2.

The embodiment shows a substrate 17 and an epitaxial layer of opposite conductivity type, parts of the epitaxial layer being converted in known manner into isolating regions 20 of the same conductivity type as the substrate 17. The remaining islandlike parts 11 of the epitaxial layer form the collector regions of the two transistors. These collector regions 11 are contacted through windows 23 by a metal strip 24 which is connected to further components of the circuit. Furthermore each collector zone 11 may include a low-resistivity part 11a in order to reduce the collector series resistance.

The resistance layer comprises a single continuous surface region 21, which may have ben formed simultaneously with the emitter regions 9. This surface region 21 is surrounded by an isolating region 20, from which it is separated by a p-n junction 25. Such a diffused resistance layer preferably has a sheet resistance between 1 and 10 ohms per square.

It should be noted that in view of the breakdown voltage of the p-n junction 25 it may be desirable for the resistance layer not to be surrounded by an isolating region, which usually has a low resistivity. In this case the resistance layer may be a further island-like region 11 the resistivity of which may, if required, be locally reduced by the provision of one or more surface regions of the same conductivity type as the island-like region. Alternatively, the configuration described with reference to FIGS. 1 and 2 may be used, in which case the semiconductor regions of the transistor and the resistance layer may be formed in the same island-like region.

The resistance layer 21 is elongated and has two opposed long edges, several fingers 5 being connected to the resistance layer 21 through windows 18 along one of the edges and the resistance layer 21 being connected to the common portion 4 of the contact 4, 5 through the window 16 along substantially the entire opposite edge.

The common portion 4 of the contact 4, 5 is connected to the connecting lead 22 common to the emitters of the transistors which lead in this embodiment comprises a metal strip which connects the emitters to a further point in the circuit. Current paths extend from the emitters through the fingers 5, the resistance layer 21, the common portion 4 and the junction or the point of attachment of the common portion 4 to the lead 22.

For satisfactory current distribution between the various emitter sub-regions 9 it is desirable for the resistance along these current paths between the emitter sub-regions 9 and the said point of attachment to be substantially equal for all sub-regions 9. In the embodiment under consideration this is achieved in that the shortest distance between a finger 5 and the common portion 4 of the contact 4, 5 is longer for a finger 5 closely adjacent to the point of attachment of the lead 22 to the common portion 4 than for a finger 5 more remote from this point of attachment. Owing to these differences in the distances between the windows 18 and the window 16, the resistance along the parts of the current path situated along the substantially homogeneous resistance layer 21 is different for each finger 5, and in a current path of which the part situated in the common portion 4 has a high resistance the part situated in the resistance layer has a low resistance, and conversely. Thus, in a simple manner the differences in the overall series resistance along the current paths which lead from the point of attachment to the emitter regions are cancelled or at least reduced for the various fingers.

A further embodiment will now be described with reference to FIGS. 5 and 6. This embodiment relates to a so-called multiemitter transistor the semiconductor body of which includes a substrate 51 of one conductivity type on which is epitaxially deposited a layer 52 which may be of the same conductivity type but has a higher resistivity. The substrate 51 and the epitaxial layer 52 together form the collector region of the transistor.

In the epitaxial layer 52 is formed a base region 53 of the opposite conductivity type which is provided with a grid 53*a* likewise of the opposite conductivity type but having a lower resistivity. The grid 53*a*, which in known manner is provided in order to reduce the base series resistance, surrounds several base parts 53*b* in which are formed emitter sub-regions 54.

The substantially plane semiconductor surface is covered by an insulating layer 55 on which extend a base contact 56 and an emitter contact 57, 58. The emitter contact 57, 58 comprises fingers 58 which make contact with the emitter sub-regions 54 through windows 59 and are connected to a contact portion 57 common to the fingers 58. The common portion 57 of the emitter contact and the base contact 56 form an interdigitated pattern, the portion 57 and the contact 56 interlocking in a comb-like manner.

According to the invention, a resistance layer 60 extends as a layer-shaped region over the insulating layer 54. In this embodiment, two resistance layers 60 are provided with make electric contact with fingers 58 and also with the common portion 57, each of the paths which connect the fingers 58 to the common portion including a part of a resistance layer 60 as a series resistors. The resistance layers 60 are substantially homogeneous and the distances between each finger 58 and the common portion 57 and the spacings between the adjacents are chosen so that the resistance in the resistance layer 60 between adjacent fingers 58 is higher than the resistance in the resistance layer 60 between each finger 58 and the part 57 common to the fingers.

The embodiment shown in FIGS. 5 and 6 may entirely be manufactured in a manner commonly used in semiconductor technology. The resistance layers 60 may be deposited from the vapour phase and this deposition mayxbe effected before or after the formation of the metal pattern of the contacts 56 and 57, 58. The resistance value of the series resistor included in the contact 57, 58 depends not only on the material, which may be titanium, but also on the thickness of the resistance layer 60, on the spacings between the fingers 58 and the titanium layer 60 may have a thickness of 0.2 to 0.5 $\mu$m, the sheet resistance verying from about 2.5 to 7 ohms per square. The widths of the fingers 58 and the spacings between the fingers 58 and the common portion 57 may be about 10 to 30 $\mu$m.

The base contact 56 and the common portion 57 of the emitter contact may be provided with connecting leads in known matter and the semiconductor body may also be encapsulated in known manner.

This multi-emitter transistor shown satisfactory current distribution of the overall emitter current between the variuos emitter sub-regions and may be simply manufactured, the formation of the series resistors in the emitter contact introducing no critical photolithographic steps into the frabicating process.

Obviously, the invention is not restricted to the embodiments described and for one skilled in the art many variants are possible without departing from the scope of the invention. The semiconductor body may consists of one of the usual semiconductor materials, such as silicon, germanium or a $A_{III}$-$B_V$ compound and the insulating layer may consist not only of silicon dioxide but also of, for example, silicon nitride. The semiconductor body need not be a substrate provided with an epitaxial layer but may be substantially homogeneous or may, for example, consist of a semiconductor body the conductivity of which, except for a surface layer, is increased by diffusion of an impurity. Furthermore the surface layer and the substrate may be of different conductivity types.

In addition, the fingers of the contact need not all be connected to separate regions or sub-regions of the contacted semiconductor circuit element, but several fingers may make contact with one continuous semiconductor region, the included series resistors influencing the current distribution over this single semiconductor region.

The resistance value of the series resistors may be adjusted by adjustment of the dimensions of the conductive pattern of the fingers at the areas where contact is made to the resistance layer. In the case of a diffused resistance layer, for example, widening of the contact windows results in a reduction of the series resistance.

It will also be appreciated that, for example, the opposed long edges of the resistance layer 21 shown in FIG. 3 need not be parallel but that the lateral shape of the resistance layer may also be matched to the resistance values desired for the various fingers and that furthermore the shape and/or the location of the contact window 16 will influence the resistance values of the various series resistors.

What is claimed is:

1. A semiconductor device comprising a semiconductor body having a substantially plane surface, said body comprising plural regions adjacent the surface of at least one circuit element, an insulating layer on the body surface, a common contact on said insulating layer and laterally spaced from said regions, a plurality of spaced finger connections on the insulating layer, said fingers making contact with said regions through holes in the insulating layer, and means forming a resistor in series between the common contact and each of the finger connections, said resistor forming means comprising a continuous resistance layer separated from said regions and laterally spaced from said holes in the insulating layer, said common contact being connected to one portion of the resistance layer, said finger connections being connected to other portions spaced from said one portion of the resistance layer, said resistance layer further comprising a first semiconductor surface region in the body completely surrounded by a second semiconductor region, the second semiconductor region forming a first *p-n* junction with the first semiconductor region and a second *p-n* junction with the underlying part of the semiconductor body, and means being provided to short-circuit at least one of the first and second *p-n* junctions.

2. A semiconductor device as set forth in claim 1 wherein the first surface region is subdivided into plural spaced subregions each inset in the second region and each forming its own *p-n* junction with the second region, said short-circuiting means short-circuiting each of the *p-n* junctions formed between each subregion and the second region.

3. A semiconductor device as set forth in claim 2 wherein the common contact makes contact through a hole in the insulating layer with the second region and the subregions across their *p-n* junctions to constitute the short-circuiting means.

4. A semiconductor device comprising a semiconductor body having a substantially plane surface, said body comprising plural emitter regions each having a surface coplanar with said plane surface, an insulating layer on the plane surface, a plurality of spaced finger connections on the insulating layer, each finger connection making contact with an emitter region through a hole in the insulating layer, and a continuous resistance layer disposed on the insulating layer and having a long edge facing the holes in the insulating layer, and being spaced therefrom, an elongated common emitter contact connected to an elongated upper surface portion of the resistance layer spaced apart from said edge, said finger connections being each connected to other upper surface portions of the resistance layer near said edge and being spaced apart from each other and from said elongated portion at such distances that the resistance between each finger connection and the common emitter contact is substantially alike.

5. A semiconductor device as set forth in claim 4 wherein the resistance layer has a construction such that the resistance thereof between two adjacent finger connections is at least equal to that between each of said two finger connections and the said common contact, and the resistance layer extends beyond all of the finger connections a distance at least equal to one-half the finger connection spacing.

6. A semiconductor device as set forth in claim 4 wherein the resistance layer has two opposed long edges, said finger connections being connected to spaced portions of the resistance layer along at least one of the long edges, and the common contact being connected to an elongated portion of the resistance layer between said edges.

7. A semiconductor device as set forth in claim 6 wherein a connecting lead is attached to the common contact, the resistance layer is a substantially homogeneous layer, and the shortest distance in the resistance layer between the common contact and a finger located close to the point of attachment of the connecting lead is longer than the corresponding distance for a finger connection more remote from the said point of attachment.

8. A semiconductor device as claimed in claim 4, wherein the resistance between each finger connection and the common emitter contact is less than the resistance between the finger connections.

9. A semiconductor device comprising a semiconductor body having a substantially plane surface, said body comprising plural regions of the same type of conductivity adjacent the surface of at least one circuit element, an insulating layer on the body surface, a plurality of spaced finger connections on the insulating layer, said finger connections making contact with at least one of said regions through holes in the insulating layer, a continuous resistance layer separated from said plural regions, an elongated common contact connected to one upper surface portion of the resistance layer, said finger connections being connected to other upper surface portions spaced from said one portion of the resistance layer, the resistance layer comprising a semiconductor region in the body having a surface coplanar with said plane surface and separated from the adjacent part of the semiconductor body by a *p-n* junction.

10. A semiconductor device as claimed in claim 9 wherein a connecting lead is attached to the common contact, the resistance layer is a substantially homogeneous layer, and the shortest distance in the resistance layer between the common contact and a finger located close to the point of attachment of the connecting lead is longer than the corresponding distance for a finger more remote from the said point of attachment.

* * * * *